(12) United States Patent
Gartrell et al.

(10) Patent No.: US 9,843,470 B1
(45) Date of Patent: Dec. 12, 2017

(54) PORTABLE DATA CENTER

(71) Applicant: Amazon Technologies, Inc., Reno, NV (US)

(72) Inventors: John Ryan Gartrell, Seattle, WA (US); David Brian Lennon, Reston, VA (US); Gregory David May, Tacoma, WA (US); Mark Edward Stalzer, Arlington, VA (US)

(73) Assignee: Amazon Technologies, Inc., Reno, NV (US)

( * ) Notice: Subject to any disclaimer, the term of this patent is extended or adjusted under 35 U.S.C. 154(b) by 276 days.

(21) Appl. No.: 14/039,589

(22) Filed: Sep. 27, 2013

(51) Int. Cl.
*H04L 29/08* (2006.01)
*H05K 7/14* (2006.01)

(52) U.S. Cl.
CPC ............ *H04L 29/08* (2013.01); *H05K 7/1485* (2013.01)

(58) Field of Classification Search
None
See application file for complete search history.

(56) References Cited

U.S. PATENT DOCUMENTS

| | | | | |
|---|---|---|---|---|
| 4,574,955 A | * | 3/1986 | Camossi | B65D 81/07 206/386 |
| 2003/0023594 A1 | * | 1/2003 | Ramamurthi | G06F 17/30011 |
| 2005/0057849 A1 | * | 3/2005 | Twogood | G11B 33/022 360/97.12 |
| 2010/0139887 A1 | * | 6/2010 | Slessman | F28F 9/0265 165/67 |
| 2012/0246661 A1 | * | 9/2012 | Nishimura | G06F 9/50 718/106 |
| 2012/0300391 A1 | * | 11/2012 | Keisling | H05K 7/20745 361/679.46 |
| 2014/0297855 A1 | * | 10/2014 | Moore | G06Q 10/087 709/224 |
| 2015/0136939 A1 | * | 5/2015 | Haselden | H05K 7/1497 248/608 |

OTHER PUBLICATIONS

"Dell Launches Enterprise Class Fully Mobile Data Center Solution to Power Mobile Government and Military Operations"; www.dell. com; Copyright 2014; accessed Sep. 18, 2014; 2 pages.

* cited by examiner

*Primary Examiner* — Lance Leonard Barry
*Assistant Examiner* — Mohammad Yousuf A Mian
(74) *Attorney, Agent, or Firm* — Baker & Hostetler LLP

(57) ABSTRACT

A portable data center is configured to be supported by any suitable self-propelled motor vehicle, and transported to a client location, such that a large volume of data can be transmitted to, and stored on, computing devices of the portable data center via a hard wire communication link. The portable data center can then be transported to a data center building so as to store the data received at the client location on one or more computing devices housed in the data center building.

24 Claims, 6 Drawing Sheets

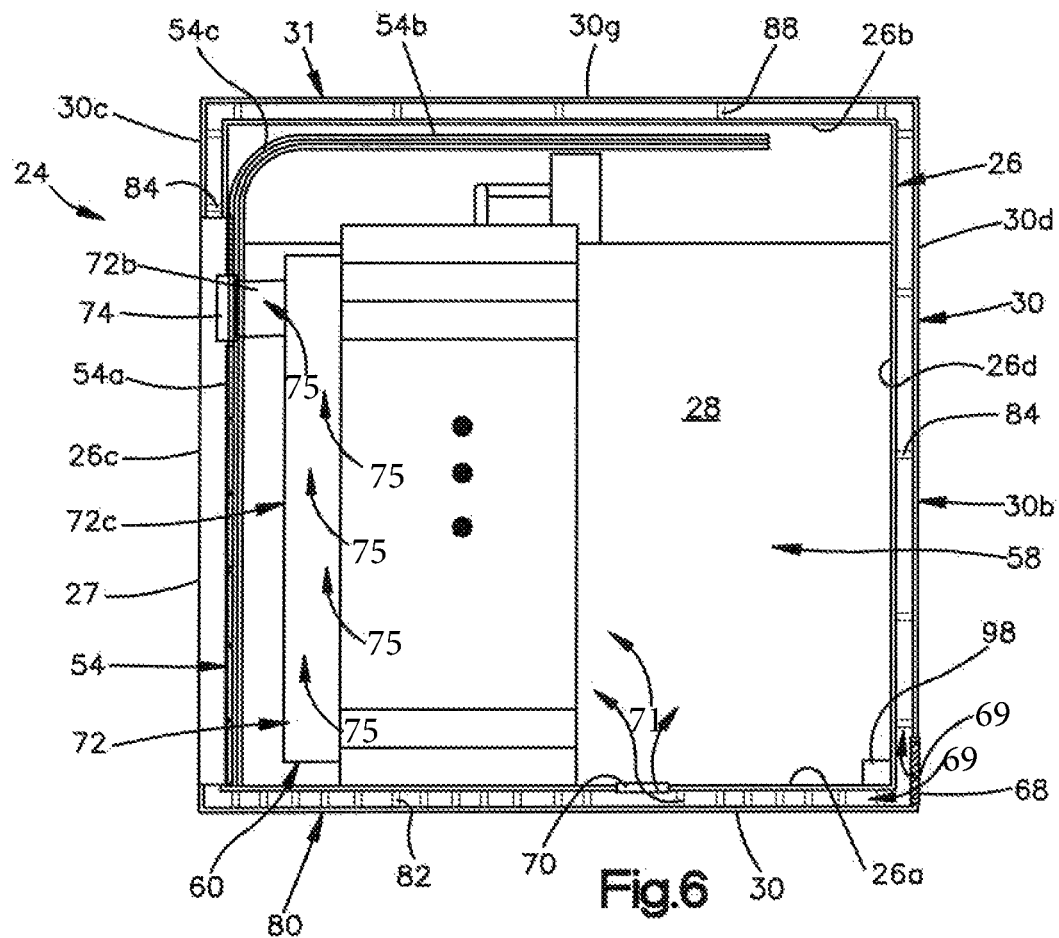
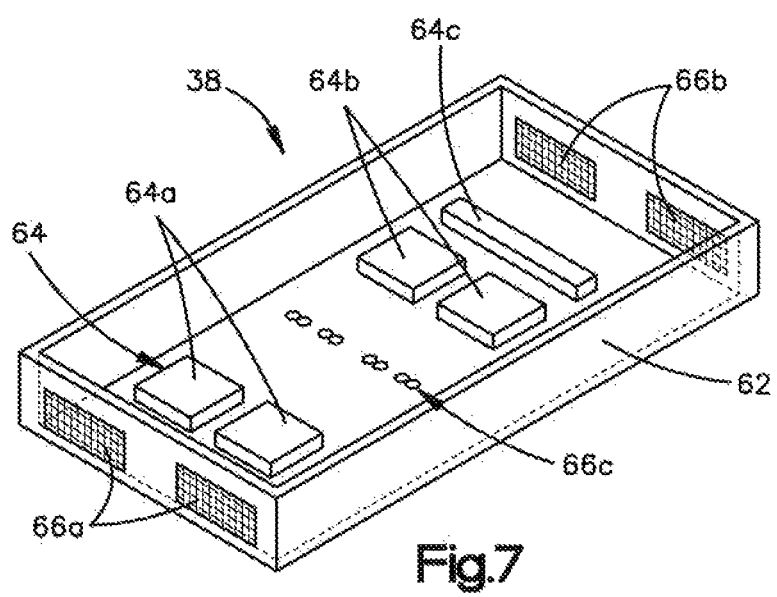

PORTABLE DATA CENTER

BACKGROUND

Computing-intensive or data-intensive organizations such as on-line retailers, Internet service providers, search providers, financial institutions, and the like often conduct computer operations from large scale computing facilities, known as data centers. Such computing facilities house and accommodate a large number of server, network, and other computer equipment suitable to process, store, and exchange data as desired to facilitate the organization's operations. Data centers are often located remote from the organization, such that data is exchanged to and from the data center over the internet. Unfortunately, transmitting high volumes of data over the internet can be costly and time consuming.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 6 is a schematic end elevation view of the portable data center illustrated in FIG. 1A;

FIG. 7 is a representative schematic perspective view of the computing devices of the portable data center illustrated in FIG. 1A.

DETAILED DESCRIPTION

Figure 1:
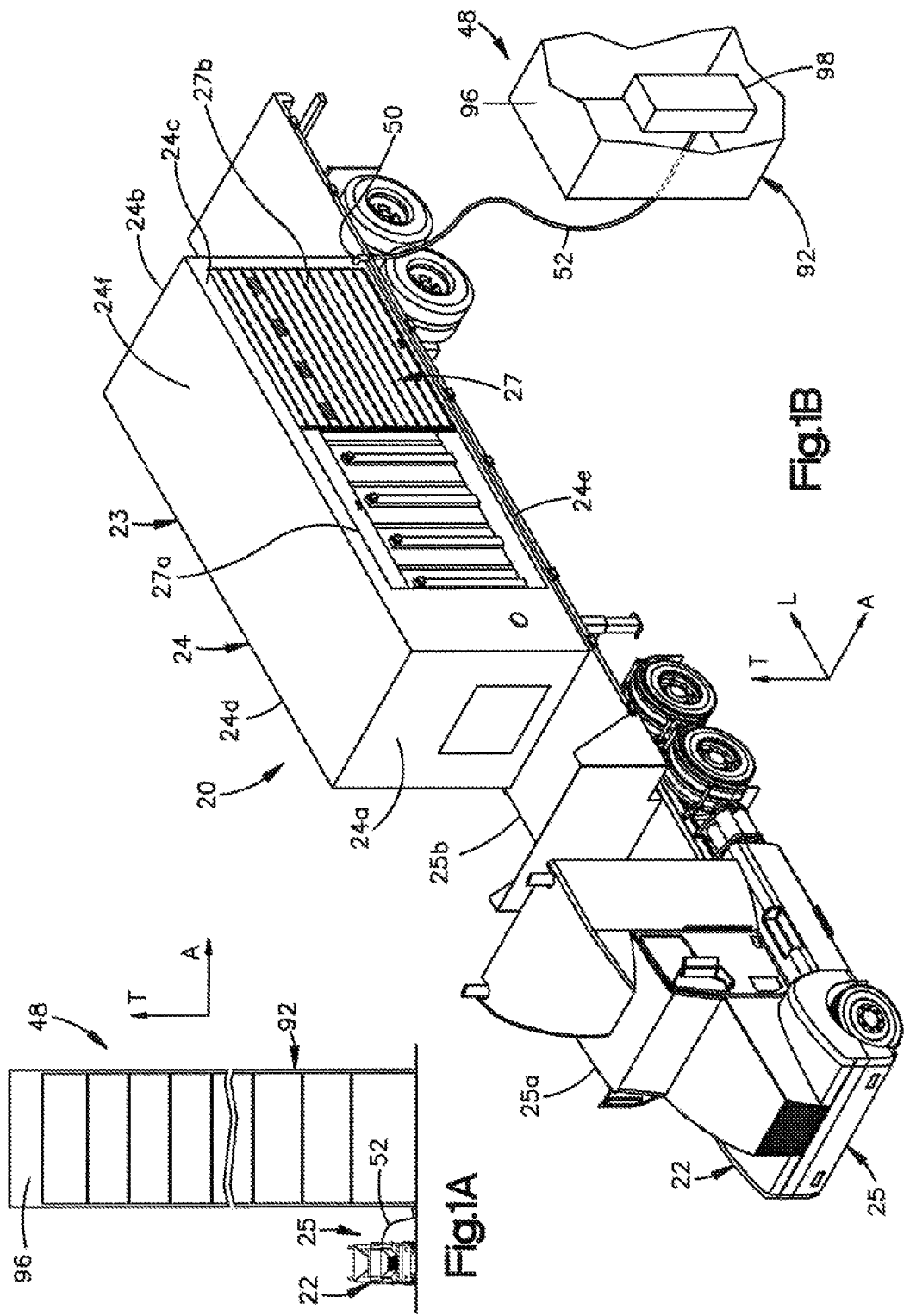
FIG. 1A is a schematic perspective view of a mobile data storage system constructed in accordance with one embodiment, including a mobile vehicle and a portable data center supported by the mobile vehicle, connected to a computing device of a client at a client location over a hardwire communication line.
FIG. 1B is an enlarged schematic perspective view of the mobile data storage system illustrated in FIG. 1 A, showing the portable data center connected to the computing device, showing only a portion of the client location.

Systems and methods in accordance with various embodiments of the present disclosure provide the ability to transport a portable data center to a remote client location, to transmit data from the client location to computing devices aboard the portable data center, to transport the portable data center to another stationary data center, and to transmit the data from the portable data center to the stationary data center. For example, in one embodiment, the transport can occur on a trailer, other road vehicle, boat, train, airplane, or any suitable mobile vehicle. In accordance with one embodiment, the portable data center can include an exterior housing and an interior housing that is supported by the exterior housing via a vibration dampening media so as to reduce the vibrations of the computing devices aboard the portable data center, for instance during transport. The portable data center can include on-board power supply that supplies power to the computing devices aboard the portable data center. The portable data center can further include a heat removal system that is configured to deliver ambient air to the computing devices during operation. The portable data center can further include a data management system that is configured to receive data from the remote location over a conduit and deliver the received data to one or more of the computing devices aboard the remote data center.

According to one embodiment, because the computing devices of the portable data center are configured to receive data from the remote client location over a hardwire communication line, data can be transmitted faster and less expensively compared to transmitting data to a remote data center over the Internet.

According to another embodiment, the data center is transportable over land, air, water, or a combination thereof.

As used herein, "portable data center" includes any transportable facility or portion of a facility in which computer operations are carried out. A portable data center may include servers dedicated to specific functions or serving multiple functions. Examples of computer operations include information processing, communications, testing, simulations, power distribution and control, and operational control.

As used herein, "computing room" refers to a room in a data center in which at least one rack resides. The room can be fully or partially defined by at least one computing room wall in the data center, or can be defined by an open space in a data center. The computing room wall can be disposed within the data center, or can be defined by an exterior wall of the data center.

As used herein, "rack housing" refers to a housing that at least partially defines an interior space within which at least one rack resides.

As used herein, "rack" refers to a rack, container, frame, bracket, plurality of brackets, shelving, or any other element or combination of elements that can contain or physically support one or more computing devices.

As used herein, "computing device" includes any of various devices in which computing operation or data storage can be performed. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices including routers, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively or additionally, memory may include a compact disc-read only memory (CD-ROM), a magneto-optical disk (MOD), and/or a digital versatile disc (DVD). Also, additional input channels may include computer peripherals associated with an operator interface such as a mouse and a keyboard. Alternatively, other computer peripherals may also be used that may include, for example, a scanner. Further, in some embodiments, additional output channels may include an operator interface monitor and/or a printer.

As used herein, "hardwire communication line" refers to any electrical wire, cable, or the like that is configured to receive and transmit data. Hardwire communication lines can include copper cabling, fiber cabling, or any alternative cabling suitable for data transfer.

Figure 2:
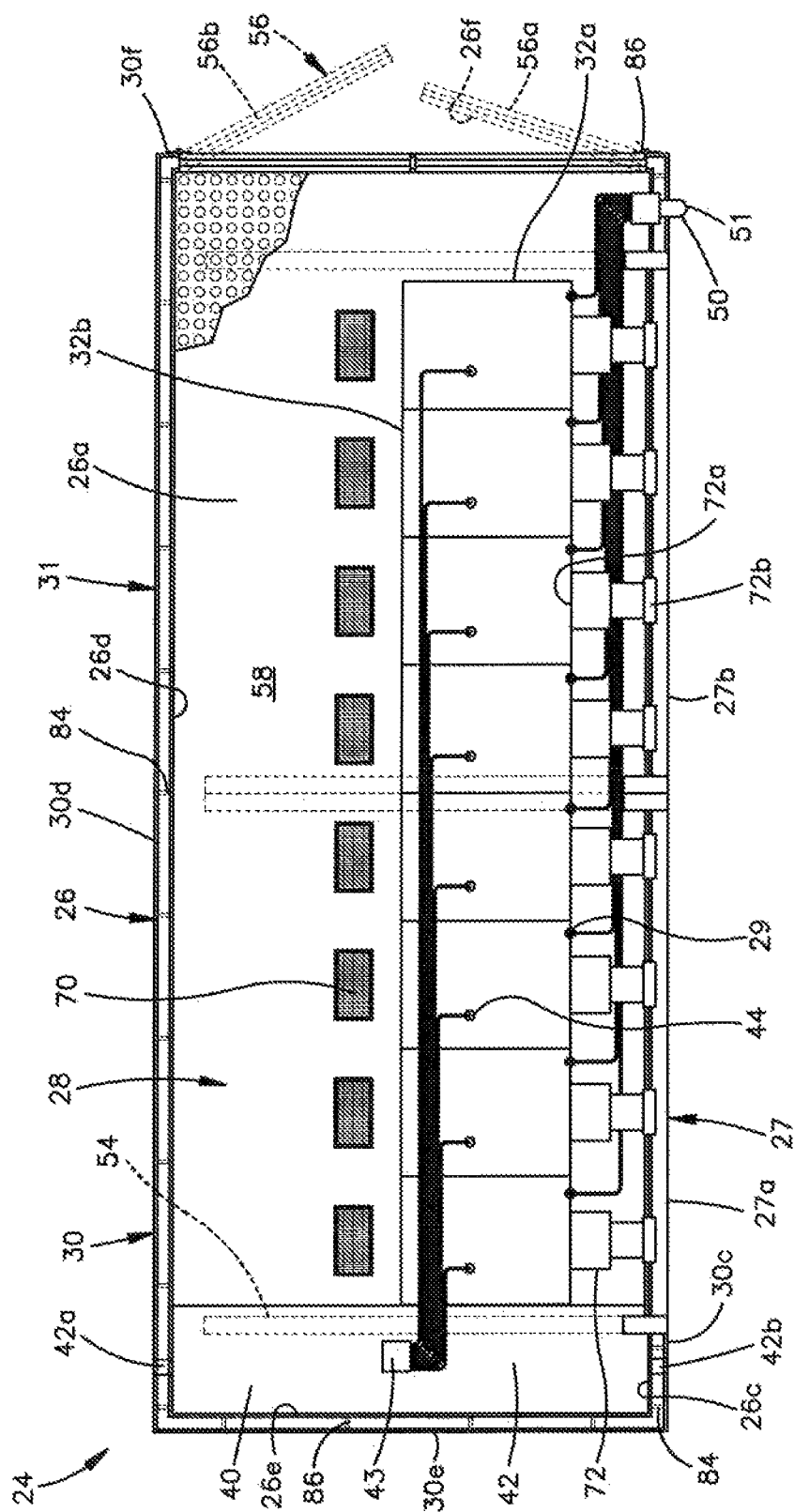
FIG. 2 is a schematic top plan view of the portable data center illustrated in FIG. 1A, showing portions cut away.
Figure 3A:
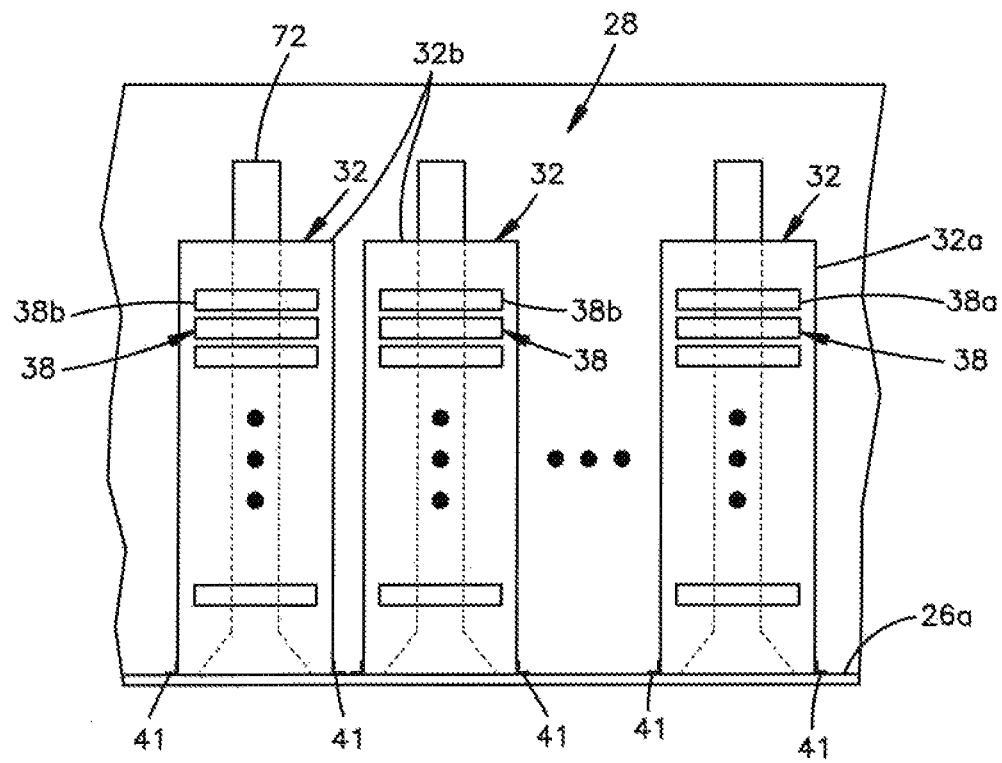
FIG. 3A is a schematic front elevation view of a plurality of rack systems disposed in the portable data center illustrated in FIG. 1A.
Figure 3B:
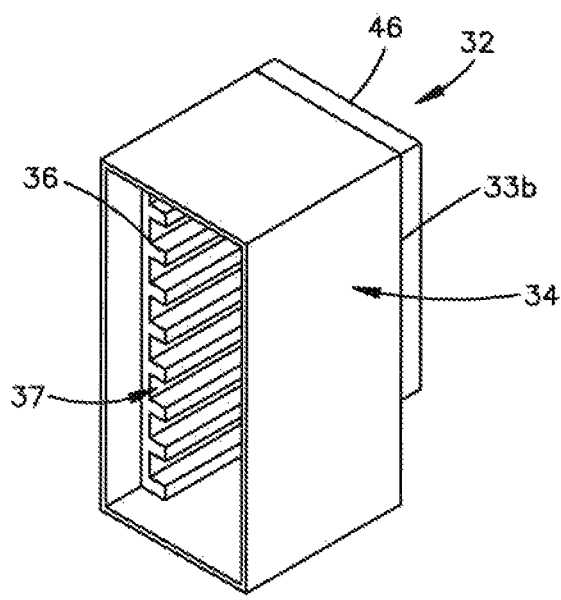
FIG. 3B is a schematic perspective view of one of the rack systems illustrated in FIG. 3A.
Figure 4:
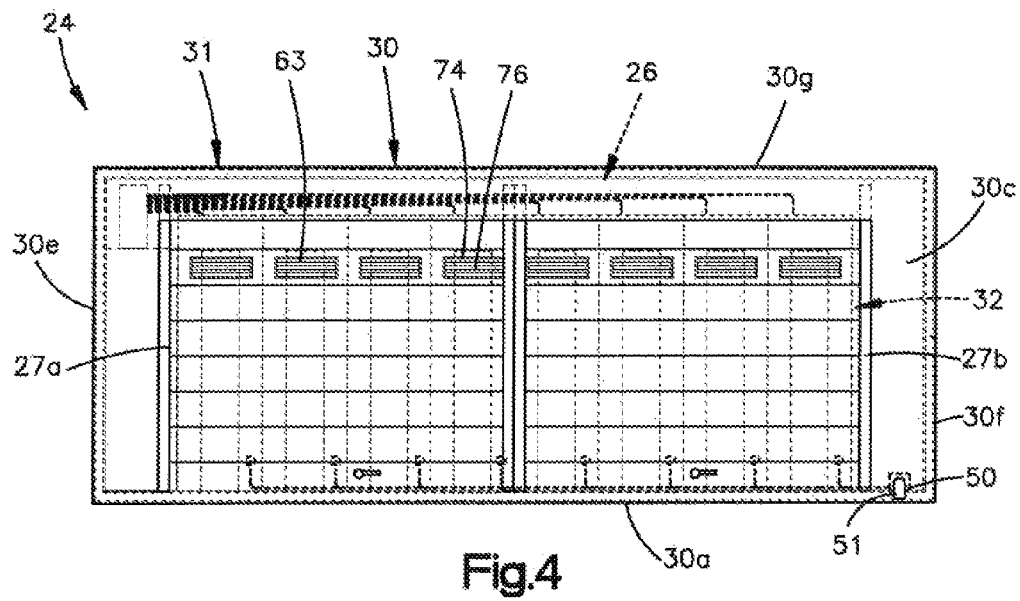
FIG. 4 is a schematic side elevation view of the portable data center illustrated in FIG. 1A.
Figure 5:
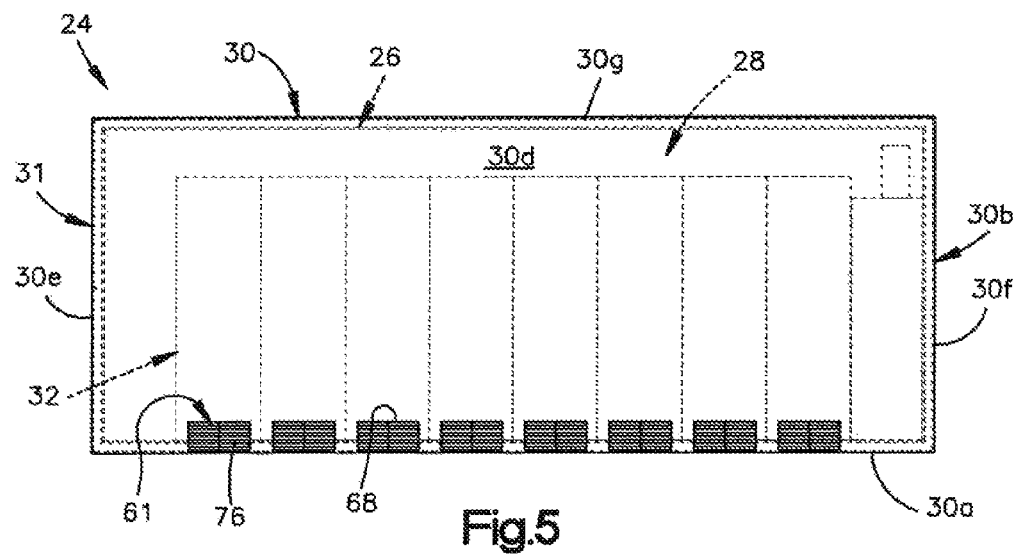
FIG. 5 is a another schematic side elevation view of the portable data center illustrated in FIG. 1A.
Figure 8:
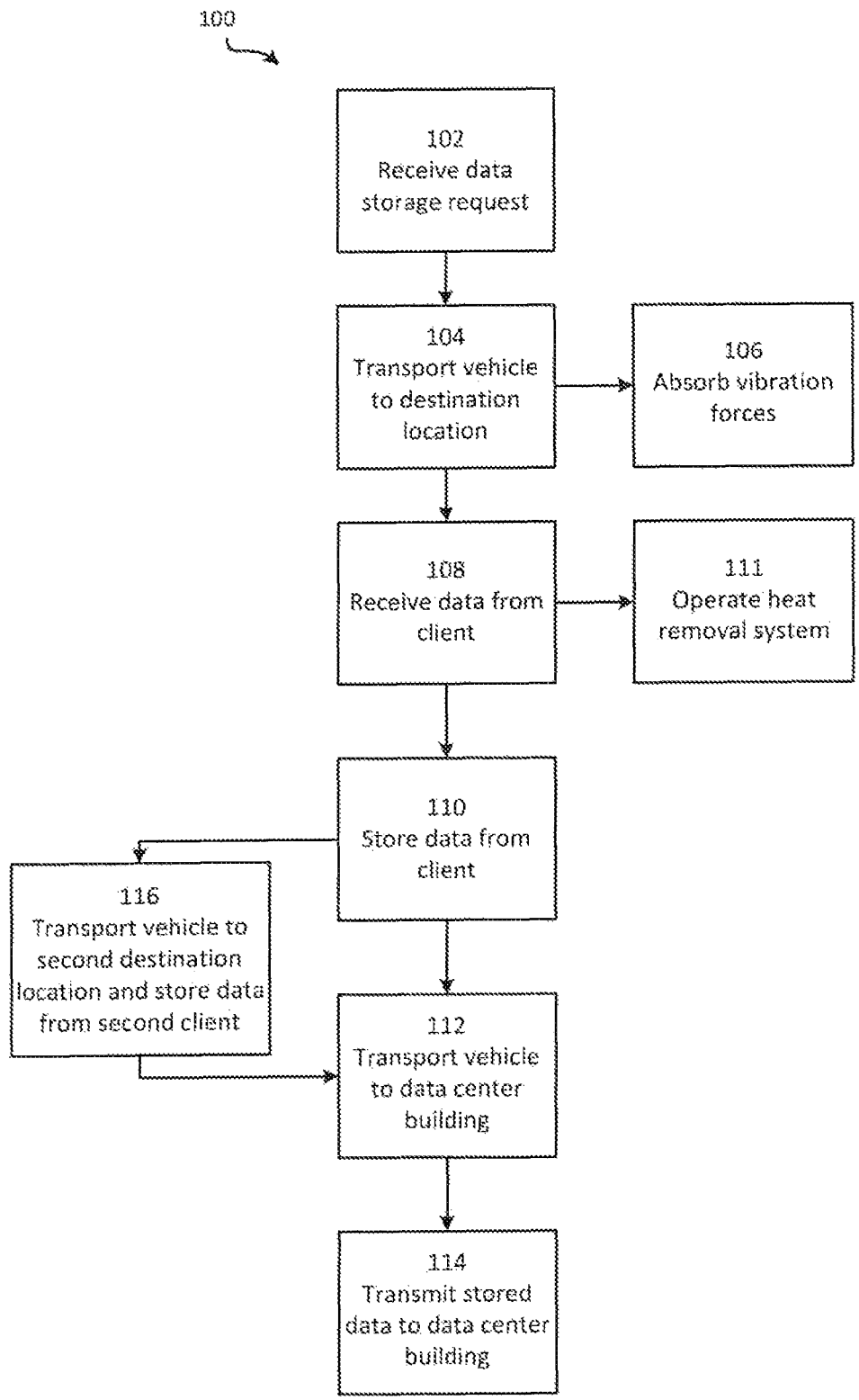
FIG. 8 is a flow chart illustrating a method of operating the mobile data storage system illustrated in FIG. 1.

Referring to FIGS. 1A-2, a mobile data storage system 20 can include a mobile vehicle 22, and a portable data center 24 that is configured to be removably supported by the mobile vehicle 22. The mobile vehicle 22 can be configured as any suitable self-propelled motor vehicle, such as a truck 25 of the type including a self-propelled tractor 25a and trailer 25b that is towed by the tractor 25a as illustrated. Alternatively, the land vehicle can be configured as any alternatively constructed truck, train or any alternative suitably constructed land vehicle as desired. Alternatively still, the vehicle can be configured as a water vehicle, such as a ship, an air vehicle such as an airplane, or any alternative vehicle suitable to transport the portable data center 24 as described herein. Thus, the portable data center 24 can be supported by the mobile vehicle 22, which can include on the mobile vehicle 22, for instance on the trailer 25b, or in the mobile vehicle 22, for instance in a train car, a compartment of an airplane, in an enclosed trailer, or the like.

The portable data center 24 includes a computing housing 26 that defines a computing room 28, and can further include a support structure 30 that supports the computing housing 26. Accordingly, the support structure 30 is configured to be supported by the mobile vehicle 22, and the computing housing 26 is supported by the support structure 30. In this regard, it should be appreciated that the portable data center 24 is non-vehicular, and thus is reliant upon the mobile vehicle for transportation. Reference herein to a data center housing 23 can include one or both of the computing housing 26 and the support structure 30. Thus, reference to various apparatus that extends through the data center housing 23 can extend through the computing housing 26 alone or in combination with the support structure 30, it being appreciated that the support structure 30 need not continuously encapsulate an entirety of the computing housing 26, though the support structure 30 can be continuous and encapsulate an entirety the computing housing 26 if desired. The portable data center 24, including the computing room 28 and the support structure 30, defines a front end 24a and a rear end 24b spaced from the front end 24a along a longitudinal direction L, opposed first and second sides 24c and 24d spaced from each other along a lateral direction A that is substantially perpendicular to the longitudinal direction L, and a bottom end 24e and a top end 24f that is spaced from the bottom end 24e along the transverse direction T that is substantially perpendicular to both the longitudinal direction L and the lateral direction A. For the purposes of form and clarity, the portable data center 24 is illustrated as oriented such that the lateral direction A and the longitudinal direction L are oriented along a horizontal direction, and the transverse direction T is oriented in a vertical direction. The front end 24a can be said to be spaced from the rear end 24b in a forward direction, and the rear end 24b can be said to be spaced from the front end 24a in a rearward direction. The top end 24f can be said to be spaced from the bottom end 24e in an upward direction, and the bottom end 24e can be spaced from the top end 24f in a downward direction. Thus, directional terms "forward," "rearward," "upward," "downward," and derivatives thereof can refer to the above-identified forward direction, rearward direction, upward direction, and downward direction, respectively, unless otherwise indicated.

The computing housing 26 can define a floor 26a and a ceiling 26b that is spaced from the floor 26a in the upward direction along the transverse direction T, first and second side walls 26c and 26d that extend upward from the floor 26a to the ceiling 26b along the transverse direction T and are spaced from each other along the lateral direction A, and a front wall 26e and a rear wall 26f that extend up from the floor 26a to the ceiling 26b along the transverse direction T and are spaced from each other along the longitudinal direction L such that the front wall 26e is spaced from the rear wall 26f in the forward direction. The portable data center 24 can be configured as a shipping container, and can for instance be sized as a twenty foot equivalent unit shipping container (TEU) or alternatively sized as desired.

Referring now to FIGS. 1A-3B, the portable data center 24 further includes a plurality of rack systems 32 disposed in the computing room 28 and supported, directly or indirectly, by the floor 26a. Each rack system 32 includes a rack housing 34 and a respective rack 36 supported by the rack housing 34. Each rack system 32 can further include at least one computing device 38 such as a plurality of computing devices 38 that are configured to be mounted to the rack 36. For instance, each rack 36 can define a plurality of bays 37 that are each configured to receive a computing device 38 that is supported by the rack 36, though it should be appreciated that the rack 36 can define any suitable alternative shape and size as desired so as to support the computing devices 38 in any alternative manner as desired. Each rack system 32 can further include one or more brackets 41 that attach the rack housing 34 to the floor 26a of the computing housing 26, or any suitable support surface as desired, or the rack housings 34 can be free standing on the floor 26a of the computing housing 26 or any suitable support surface as desired.

It should be appreciated that, depending on a desired storage capacity of the portable data center, the portable data center 24 can be equipped with any number of computing devices 38 as desired up to the capacity of the portable data center 24. Accordingly, one or more of the rack systems 32 up to all of the rack systems 32 can include at least one computing devices 38 supported by respective rack 36. For instance, one or more of the rack systems 32 up to all of the rack systems 32 can include a plurality of computing devices 38 supported in a corresponding one of each of the bays 37 of the rack system 32. Furthermore, one or more of the rack systems 32 can be devoid of computing devices 38 if desired.

In one embodiment, the computing devices 38 may comprise one or more servers configured to store data. In one embodiment, these servers may be configures as disk storage. As a further example of a disk storage device, the computing devices 38 may be configured as a set of low cost disk memories wherein sets of disks within the computing device 38 may be in operation while at least one other set of disks in computing device 38 are not in operation. In such an example, operating only a portion of the disks in example computing devices 38 may provide energy consumption benefits.

In another embodiment, computing devices 38 may comprise a higher speed memory, such as a block-level storage service. A block-level storage service may process requests to read to and write from disk via a network link. In effect, storage drivers of other computing devices may access the block-level storage service as if the block-level storage service were a local disk. The block-level storage service may present a network-mountable storage volume to these other computing devices, and these other computing devices may mount this network-mountable storage volume, and issue requests to read to and write from this volume as if it were a local disk. In an embodiment, the computing devices 38 may comprise a combination of low and high speed (or high IOPS, or other metric) memory devices. As such, as one example, data may be loaded onto the high speed memory devices during connection with the building at the customer location and, after being detached from building, the memory may be transferred from the high speed devices to the low speed devices.

The plurality of rack systems 32 can include a first at least one rack system 32*a*, which can be a network rack system, that includes a respective first rack of the plurality of racks 36, and at least one computing device 38, which can be configured as at least one network device 38*a*, supported by the first rack of the first at least one rack system 32*a*. For instance, the first at least one rack system 32*a* can include a plurality of network devices 38*a* supported by the respective first rack of the first at least one rack system 32*a*. The network devices 38*a* can include, as an example, an aggregation layer, a control server, patch panels, out-of-band router, a switch panel, system management hosts, security systems, and any additional devices a desired. The plurality of rack systems 32 can further include a second at least one rack system 32*b*, such as a plurality of second at least one rack systems 32*b*, that each includes a respective second rack of the plurality of racks 36 and at least one computing device 38 such as a plurality of computing devices 38, which can be configured as data storage devices 38*b*, supported on the respective second rack of the plurality of racks 36. The first at least one rack system 32*a* can be disposed at the rear end of the computing room 26, and the second at least one rack systems 32*b* can be disposed forward from the first at least one rack system 32*a*. It should be appreciated that one or more network devices 38*a* can be supported on the respective racks 36 of the plurality of second at least one rack system 32*b*, and one or more data storage devices can be supported on the rack 36 of the first at least one rack system 32*a* as desired.

Each of the rack systems 32 can further include at least one data bus 29, which can be supported by the corresponding rack housing 34. The at least one data bus 29 of each of the rack systems 32 are configured to be placed in communication with the respective computing devices 38 supported by the rack 36 of the respective rack system 32. The at least one data busses 29 of the first at least one rack system 32*a* is configured to be placed in communication with each of the data busses of the second plurality of rack systems 32*b*. Accordingly, the at least one data storage device 38*b* supported by the racks 36 of the second plurality of rack systems 32*b* are configured to be placed in communication with the at least one network device 38*a*. As will be appreciated below, the at least one network device 38*a* is configured to route data to be stored on preselected ones of the data storage devices 38*b* pursuant to any suitable data storage protocol as desired.

As will be appreciated further from the description below, the a mobile vehicle 22, and thus the portable data center 24 supported by the mobile vehicle 22, is configured to be transported to a remote destination location, which can be a client location 48, in response to a data storage request that is received from a client. The portable data center 24 can include a data port 50 that extends through the data center housing 23 and is configured to be connected to, and thus placed in connection with, a hardwire communication line 52 that is further configured to be connected, directly or indirectly, to the at least one client computing device 98 at the client location 48, which can be configured as a data center. The hardwire communication line 52 can be a fiber optic cable, co-axial cable, Ethernet cable, or any suitable alternatively constructed hardwire communication line suitable to transmit data from the client location 48 to the portable data center 24. Thus, the data port 50 is configured to receive data from the client at the client location over the hardwire communication line 52. In particular, the data can be received from at least one client computing device 98 at the client location 48 that is also connected to the hardwire communication line 52, alone or in combination with at least one or more computing devices at a location that is remote from the client location 48 but networked with one or more computing devices at the client location 48. The client location 48 can be a building 96, and the at least one client computing device 98 can be located anywhere in the building or at any other location that is in communication with a network in the building. The data port 50 can extend through the first side 24*c* of the portable data center 24, for instance at the rear of the first side 24*c*, so as to be disposed adjacent the first at least one rack system 32*a*. The data port 50 is in communication with the at least one network device 38*a*, such that the network device 38*a* is configured to route the received data to at least one of the data storage devices 38*b*, such as respective ones of the computing devices 38 supported by the racks 36 of the second plurality of rack systems 32*b*. In accordance with one embodiment, the hardwire communication line 52 can be connected to a data port of the building 96, which in turn is connected to the at least one client computing device 98 over another hardwire communication line so as to permit data communications between at least one of the computing devices, for instance the at least one network device 38*a*, and the at least one client computing device 98 of the client. The portable data center 24 can further include a protective shroud 51 that at least partially or entirely surrounds the data port 50 and can protect the data port 50 from climactic elements, including snow and rain. It should be appreciated that the portable data center 24 can further include wireless communication modules suitable to communicate with a remote location, for instance to receive control information from the remote location. The control information can include data management information, such as storage protocol that manages the distribution of data from the network devices 38*a* to the data storage devices 38*b*, or any suitable alternative information related to the operation of the portable data center 24.

With continuing reference to FIGS. 1A-3B, the portable data center 24 can further include at least one electrical power source 40 that is configured to provide power to at least a plurality of the computing devices 38, including each of the computing devices 38. In accordance with one embodiment, the at least one electrical power source 40 can be configured as an on-board electrical power source that does not receive electrical power from the mobile vehicle 22, but rather generates its own electrical power and transmits the generated power to the computing devices 38. In accordance with the illustrated embodiment, the at least one electrical power source 40 is configured as any suitable electrical generator 42 as desired, such as an engine-generator that includes a fuel port 42*a* that can extend through the data center housing 23, and configured is to receive fuel such as diesel fuel. The electrical generator 42 can be configured to convert combustion of the fuel to electrical power. The electrical generator 42 can include an exhaust port 42b that extends through the data center housing 23, and is configured to emit fuel combustion exhaust out of the exhaust port 42b. It should be appreciated that the portable data center 24 can include any number of electrical generators, alternative electrical power sources, or combinations thereof, as desired. Alternatively, the at least one electrical power source 40 can receive some or all of the power to be supplied to the computing devices can be provided by the mobile vehicle 22 as desired. The at least one electrical power source 40 can be disposed at the front end of the portable data center 24, and the front end 24a of the portable data center 24 can define a removable access panel to access the electrical generator 42, for instance for repairs. Alternatively, the electrical power source 40 can be provided by the engine of the vehicle 22, such that power from the engine is delivered to the computing devices 38.

Each of the rack systems 32 can thus further include at least one power distribution unit 44 that is placed in electrical communication with an electrical output 43 of the at least one electrical power source 40, and with one or more up to all of the computing devices 38 supported on the corresponding rack 36. The power distribution units 44 are configured to receive output power from the at least one electrical power source 40, and supply the received output power to the computing devices 38 during operation. Thus, the at least one electrical power source 40 is in electrical communication with the at least one network device 38a and the plurality of data storage devices 38b, so as to supply electrical power to the at least one network device 38a and the plurality of data storage devices 38b. The at least one electrical power source 40 can further include at least one backup electrical power source 46, which can be configured as at least one electrochemical battery power source that is in electrical communication with the at least one network device 38a and the plurality of data storage devices 38b. For instance, each of the rack systems 32 can include a respective backup electrical power source 46 that can be supported by the rack housing 34 and placed in electrical communication with each of the computing devices 38 supported by the rack housing 34. The computing devices 38 can receive electrical power from the respective backup electrical power source 46 so as to receive electrical power from the backup electrical power source 46 during a period of failure of the on-board power source. The backup power source can be configured as a lithium-ion backup power source or any suitable alternative backup power source as desired.

With continuing reference to FIGS. 1A-3B, the portable data center 24 can include an entry door 56 that defines at least a portion of the rear wall 26f of the computing housing 26, and is movable between an open position and a closed position so as to allow selective ingress and egress into and out of the computing room 28. It should be appreciated that the entry door 56 can be surrounded by a rear wall of the support housing 30 or not, and that a portion of the rear wall 26f of the computing housing 26 that does not, each of the rack systems 32 can be disposed adjacent one of the walls of the computing housing, such as one of the first and second side walls 26c and 26d. In accordance with the illustrated embodiment, each of the rack systems 32 is disposed adjacent the first side wall 26c. The rack systems 32 are thus adjacent to each other along the longitudinal direction L. Accordingly, each of the rack systems 32 defines a front end 33a that faces the second side wall 26d and a rear end 33b that faces the first side wall 26c and is disposed closer to the first side wall 26c than the front end 33a is spaced from the second side wall 26d along the lateral direction A. In order to maximize space in the computing room 28, it may be desirable to place the rack systems 32 as close to the first side wall 26c as desired.

The portable data center 24 can include an entry door 56 that defines at least a portion of the rear wall 26f of the computing housing 26, and is movable between an open position and a closed position so as to allow selective ingress and egress into and out of the computing room 28. It should be appreciated that the entry door 56 can be surrounded by the rear support wall 30f or not, and that a portion of the rear wall 26f of the computing housing 26 that does not define the entry door can be surrounded by the rear support wall 30f of the support housing 30. The computing room 28 defines an access aisle 58 that can extend between the rack systems 32 and the second side wall along the lateral direction A, between the rear wall 26f and the front wall 26e along the lateral direction A, and between the floor 26a and the ceiling 26b along the transverse direction T. Thus, a user positioned in the access aisle 58 can have access to the front ends 33a of the rack systems 32, for instance when installing and removing computing devices 38 in and from the racks 36. The entry door 56 can be configured as first and second entry panels 56a and 56b of the data center housing 23 that are pivotally movable along respective pivot axes that can be oriented in the transverse direction T, though it should be appreciated that the entry door 56 can alternatively move between the open and closed positions in any manner desired. For instance, the entry door 56 can pivot along any suitable alternatively oriented axis between the open position and the closed position, translate horizontally or vertically between the open position and the closed position, or can ride along one or more tracks between the open position and the closed position as desired.

Furthermore, the data center housing can include at least one access door 27, which can be defined by the first side wall 26, that can be moved between an open and a closed position. When the access door 27 is in the closed position, the access door 27 prevents access to the rack systems 32 and protects the rack systems from the ambient environment outside the portable data center 24. When the access door 27 is in the open position, the rear end 33b of the rack systems 32 can be accessed through an opening that extends through the data center housing 23. Because the data busses 29 and the power distribution units 44 can be disposed behind the rear ends 33b, that is between the rear ends 33b and the first side wall 26c, the power distribution units 44 and data busses 29 can be easily accessed when the access door 27 is in the open position. For instance, when installing the computing devices 38 in the respective racks 36 and removing computing devices from the respective racks 36, access can facilitate connection and disconnection of the power distribution units 44 and data busses 29 to and from the respective computing devices 38 to be installed and removed, respectively.

In accordance with one embodiment, the access door 27 can be defined by the first side wall 26c of the computing housing 26, and can be moved between the open and closed positions in accordance with any desired embodiment. For instance, the access door 27 can move pivotally between the open and closed positions, can translate horizontally or vertically between the open and closed positions, or can ride along one or more tracks 54 between the open and closed positions. Each of the tracks can define a first portion 54a that extends substantially along the transverse direction T, a second portion 54b that extends substantially along the lateral direction A at a location below the ceiling 26b, and a transition portion 54c, which can be curved, that extends between the first portion 54a and the second portion 54b. Thus, when the access door 27 is in the closed position supported by the one or more tracks 54, the access door is oriented substantially along a first plane that is defined by the transverse direction T and the longitudinal direction L. When the access door 27 is in the open position supported by the one or more tracks 54, the access door is oriented in a second plane that is angularly offset from the first plane. For instance, the second plane can be defined by the lateral direction A and the longitudinal direction L. Thus, an access opening extends through the data center housing 23 along the transverse direction between the access door 27 and the floor 26a. The access door 27 can be defined by first and second access panels 27a and 27b, or any number of access panels as desired, that are configured to ride along respective tracks between the open and closed positions so as to provide selective access to respective first and second ones of the plurality of rack systems 32. In particular, the first and second access panels 27a and 27b are spaced from each other along the longitudinal direction L. Because the access door 27 is positioned above the rack systems 32 when in the open position, all computing devices 38 of rack systems 32 are accessible through the opening defined by the first side 24c of the portable data center 24 when the access door 27 is in the open position.

With continuing reference to FIGS. 1A-7, the computing room 28, and thus the portable data center 24, can further include a heat removal system 60 that is configured to receive heat from the computing devices and expel the heat out the portable data center 24. The heat removal system 60 can include a first at least one air intake 61 that extends through the computing housing 26 a first location of the computing housing 26 so as to place the computing room 28 in fluid communication with an ambient environment outside the portable data center 24 for air intake from the ambient environment. The heat removal system 60 can further include a first at least one air outlet 63 that extends through the computing housing 26 at a second location of the computing housing 26 that is different than the first location so as to place the computing room 28 in fluid communication with the ambient environment outside the portable data center 24 for air exhaust into the ambient environment. Accordingly, as will be described in more detail below, the computing devices 38 are configured to draw the ambient air through the at least one air intake 61 and expel the drawn air out the air outlet 63.

Referring now to FIG. 7, the computing devices 38 can each include an outer housing 62 that contains a plurality of electrical components 64 of the computing device 38. For instance, electrical components 64 can include one or more hard drives 64a, processors 64b, and memory modules 64c. Each of the electrical components 64 can produce heat during operation of the computing device 38. The computing devices 38 can further include at least one air intake 66a that can be configured as a vent that extends through the outer housing 62, at least one air outlet 66b that can be configured as a vent that extends through the outer housing 62, and at least one fan such as a plurality of internal fans 66c that are configured to draw air from the computing room 28 through the air intake 66a. The drawn air travels through the outer housing 62 and is exhausted from the outer housing 62 through the air outlet 66b, and subsequently out the computing housing 26 out the at least one air outlet 63. As the air travels through the outer housing 62, heat is transferred from the electrical components 64 to the air, thereby removing heat from the electrical components 64. Accordingly, the temperature of the air is increased as it travels through the outer housing 62. Because the air that exists the outer housing 62 has a temperature greater than the air before being drawn into the outer housing 62, the air can be referred to as cool air prior to being drawn through the computing devices 38, and can be referred to as warm air after being exhausted from the outer housing 62.

Referring again to FIGS. 1A-6 generally, the support structure 30 at least partially encapsulates the computing housing 26 so as to define a plenum 31 that is defined between the support structure 30 and the computing housing 26. The support structure 30 can include a support base 30a that supports the computing housing 26. The support base 30 is configured to be supported on the mobile vehicle 22 during data communications between the portable data center 24 and the at least one client computing device 98 of the client at the client location 48. For instance, the support member of the mobile vehicle can be a flatbed, for instance when the mobile vehicle is configured as a truck, or can be any suitable alternative support member that has sufficient strength to support the portable data center 24.

The support structure 30 can further include at least one support wall 30b which can include at least one upstanding wall that extends up from the support base 30a, such as at least one or more up to all of first and second side support walls 30c and 30d, a front support wall 30e, and an rear support wall 30f, that extend up from the support base 30a. The at least one support wall 30b, and thus the support structure 30, can further include a top support wall 30g, such that the at least one upstanding wall extends between the support base 30a and the top support wall 30g. The at least one support wall 30b, and thus the support structure 30, can include a front end, which can be defined by the front wall 30e, and a rear end, which can be defined by the rear support wall 30f, that is spaced from the front end along a longitudinal direction L. The at least one support wall 30b, and thus the support structure 30, can further define first and second sides, which can be defined by the first and second side support walls 30c and 30d, that are spaced from each other along a lateral direction A that is substantially perpendicular to the longitudinal direction L. The at least one support wall 30b, and thus the support structure 30 can further define a top end, which can be defined by the top support wall 30g, and a bottom end, which can be defined by the support base 30a, that is spaced from the top end along a transverse direction T that is substantially perpendicular to each of the longitudinal direction L and the lateral direction A.

The air intake 61 can include at least one first air intake vent 68, such as a plurality of first air intake vents 68, that extend through the support structure 30 but not through the computing housing 26, and thus are configured to place the ambient environment in fluid communication 69 (FIG. 6) with the plenum 31 that is defined between the support structure 30 and the computing housing 26. The air intake 61 can include at least one second air intake vent 70, such as a plurality of second air intake vents 70, that extend through the computing housing 26 but not that support structure 30 so as to place the plenum 31 in fluid communication 71 (FIG. 6) with the computing room 28. The first and second air intake vents 68 and 70 can be disposed at any suitable location as desired. For instance, the first location of the first air intake vents 68 can extend through at least one side support wall of the support structure, such as the second side support wall 30d. For instance, a portion of the plenum 31 can be defined between the computing housing 26 and each of the support base 30a and the at least one side support wall, which can include the second side support wall 30d. The second location of the second air intake vents 70 can extend through the floor 26a, which can be positioned over the support base 30a such that another portion of the plenum 31 is defined between the support base 30a and the floor 26a. It should be appreciated, of course, that first location of the first air intake vents 68 can extend through any location of the support structure 30, and the second location of the second air intake vents 70 can extend through any location of the computing housing 26. The second air intake vents 70 can thus be configured as openings, for instance perforated openings, that extend through the floor 26a. Alternatively or additionally, the second air intake vents 70 can be configured as towers that project from the floor 26a toward the ceiling 26b, and define air outlets that are aligned with the air intakes 66a of the respective computing devices 38 of respective ones of the rack systems 32. During operation, the air intakes 66a receive air from the ambient environment that is drawn into the computing room 28 through the second air intake vents 70.

Each of the second air intake vents 70 can be aligned with at least a respective one of the rack systems 32 with respect to the lateral direction A. Furthermore, the portable data center 24 can include any number of first and second air intake vents 68 and 70 as desired. For instance, the portable data center 24 can include an equal number of second vents 70 and rack systems 32, such that each of the second air intake vents 70 is aligned with a respective one of the rack systems 32 along the lateral direction. Similarly the portable data center 24 can include an equal number of first air intake vents 68, second air intake vents 70 and rack systems 32.

Alternatively, the first and second air intake vents 68 and 70 can be aligned so as to define a continuous opening that extends through both the support structure 30 and the computing housing 26. Alternatively or additionally, the air intake 61 can include at least one single vent, such as a plurality of single vents, that extend through the computing housing 26 at a location that is not surrounded by the support structure 30 so as to place the computing room 28 in direct fluid communication with the ambient environment.

During operation, fans of the portable data center 24, which can include the respective internal fans 66c of the computing devices 38, including the network devices 38a and the computing devices 38 mounted in the respective racks 36, alone or in combination with additional fans in the computing room 28, induce a negative pressure within the computing room 28 and the plenum 31, so as to draw ambient through the first and second air intake vents 68 and 70, and into the computing room 28. The plenum 31 can be enclosed by the computing housing 26 and the support housing 30, with the exception of the first air intake vents 68, such that the induced negative pressure causes air from the ambient environment to be drawn through the first air intake vents 68 and into the plenum 31. Further, the internal fans 66c of the computing devices 38 force the exhaust air out of the housing 62 through the air outlet 66b after the air has received heat that was transferred to the air from the electrical components 64. The air intake 66a and the air outlet 66b can be positioned such that the drawn air flows over one or more, up to all, of the heat producing electrical components 64 in the housing 62, such that heat is dissipated from the electrical components 64.

Referring now to FIGS. 2 and 6, the portable data center 24 can further include at least one chimney 72 having at least one chimney intake 72a that is positioned to receive the expelled air that is expelled from the computing devices 38, and in particular from the internal fans 66c, a chimney outlet 72b that is aligned with the air outlet 63, and a chimney conduit 72c that places the at least one chimney intake 72a in fluid communication with the chimney outlet 72b. For instance, the portable data center 24 can include a plurality of chimneys 72 each dedicated to one or more of the rack systems 32, such that the chimneys 72 include chimney intakes 72a that are aligned with respective ones of the computing devices 38 (or bays 37 that are configured to receive the computing devices 38), and thus positioned to receive the warm air that is expelled from the air outlet 66b of the computing devices 38. For instance, at least a portion up to an entirety of the chimney intakes 72a can be aligned with at least a portion up to an entirety of the air outlet 66b of at least one of the computing devices 38. During operation, the internal fans 66c of the computing devices induce a positive pressure in a region between the computing devices 38 and the first side wall 26c of the computing housing 26, which causes the warm air to flow into the chimney intakes 72a, through the chimney conduit 72c, and out the chimney outlet 72b.

The air outlet 63 of the heat removal system 60 can include at least one air outlet vent 74, such as a plurality of air outlet vents 74, that extend through the computing housing 26 so as to place the computing room 28 in fluid communication 75 (FIG. 6) with the ambient environment. For instance, in accordance with the illustrated embodiment, the at least one air outlet vent 74 can extend through the first side 26c of the computing housing 26, which, in accordance with one embodiment, can be defined by the at least one access door 27 (see FIG. 4). Thus, the air outlet vents 74 can be disposed on the same side of the computing room as the exhaust port 42b of the electrical generator 42. In accordance with the illustrated embodiment, the number of air outlet vents 74 can equal the number of rack systems 32 and chimneys 72, though it should be appreciated that the portable data center 24 can include any number of air outlet vents 74 as desired. Further, it should be appreciated that the air outlet vents 74 can alternatively extend through the computing housing 26 and into the plenum 31, such that air exhausted out the air outlet vents 74 is expelled into the plenum. The at least one air outlet 63 can include at least one second air outlet vent that extends through the support housing 30 so as to place the plenum 31 in fluid communication with the ambient environment such that the warm air in the plenum 31 is expelled out the second air outlet vent. It should be appreciated that the plenum can thus be compartmentalized so as to define a cold air section that is in fluid communication with the first and second air intake vents 68 and 70, but sealed from the air outlet vents 74, and a warm air section that is in fluid communication with the air outlet vents 74 and the at least one second air outlet vent, but sealed from the first and second air intake vents 68 and 70. In accordance with the illustrated embodiment, the chimney outlets 72b are spaced below the ceiling 26b such that the access door 27 is disposed between the chimney outlets 72b ant the ceiling 26b when the access door 27 is in the open position.

One or more up to all of the first and second air intake vents 68 and 70 and the air outlet vents 74 can include louvers 76 that are movable between an open position and a closed position. For instance, when the louvers 76 of the first air intake vents 68 are in the closed position, the plenum 31 is isolated from the ambient environment with respect to airflow. Thus, the computing room 28 is isolated from the ambient environment with respect to airflow. When the louvers 76 of the first air intake vents 68 are in the open position, the plenum 31 is placed in fluid communication with the ambient environment in the manner described above. Thus, the computing room 28 is placed in fluid communication with the ambient environment. It should be appreciated that the second air intake vents 70 can also include louvers 76, if it is desired to provide redundant isolation between the computing room 28 and the ambient environment when the louvers 76 of the second air intake vents 70 are in the closed position, which would further isolate the computing room 28 from the plenum 31 with respect to airflow. When the louvers 76 of the second air intake vents 70 are in the open position, the computing room 28 is placed in fluid communication with the plenum 31 in the manner described above. Similarly still, when the louvers 76 of the air outlet vents 74 are in the closed position, the computing room 28 is isolated from the ambient environment with respect to airflow. When the louvers 76 of the air outlet vents 74 are in the open position, the computing room 28 is placed in fluid communication with the ambient environment in the manner described above. During operation of the computing devices 38, the louvers 76 are in the open position such that the fans of the portable data center 24 can draw the cool ambient air into the computing room 28, circulate the air through the computing devices 38, and exhaust warm air out of the computing room 28 in the manner described above. When the computing devices are off, the louvers 76 can be closed to protect the computing room 28 from ambient elements, for instance during transport of the mobile data storage system 20. For example, variations in the With continuing reference to FIGS. 1A-6, it is recognized that vibration forces will be imparted onto the mobile vehicle 22 and the portable data center 24 during transport of the mobile data storage system. Even though the computing devices 38 can be turned off and unpowered during transport, it can still be desirable to reduce the vibration forces that are communicated to the computing devices 38 and corresponding electrical components 64, such as the hard drives 64a (see FIG. 7). Accordingly, the portable data center 24 can include a vibration management assembly 80 that is configured to absorb vibration forces imparted onto the mobile vehicle 22, such that vibration forces received by the at least one data storage device is less than the vibration forces imparted onto the mobile vehicle 22. Further, vibration forces that can be imparted onto the portable data center during upload of data from the client location and subsequent download of data to the data center, for instance due to ambient weather conditions, can be absorbed by the vibration management assembly 80 so as to minimize instances of vibration-induced disk write error.

The vibration management assembly 80 includes at least one vibration dampener 82 such as a plurality of vibration dampeners that are supported in the plenum 31 and coupled between the support base 30a and the computing housing 26, such as the floor 26a of the computing housing 26. Each of the vibration dampeners 82 can have a spring constant as desired so as to reduce the vibrations imparted onto the support base 30a that are communicated to the computing housing 26, and thus the computing devices 38. In accordance with one embodiment, the vibration dampeners 82 define a first plurality of vibration dampeners that are supported in the plenum 31 between the support base 30a and the computing housing 26. For instance, the vibration dampeners 82 can extend from the support base 30a to the floor 26a. Thus, the vibration dampeners 82 are configured to absorb at least a portion of vibrational forces that have a directional component in the transverse direction T.

The vibration management assembly 80 can further include a second plurality of vibration dampeners 84 that are supported in the plenum between the at least one side support wall, for instance each of the side support walls 30c and 30d, and the computing housing 26. For instance, one or more up to all of the second plurality of vibration dampeners 84 can extend from the first side support wall 30c to the first side wall 26c of the computing housing 26. Alternatively or additionally, one or more up to all of the second plurality of vibration dampeners 84 can extend from the second side support wall 30d to the second side wall 26d of the computing housing 26. Thus, the second plurality of vibration dampeners 84 are configured to absorb at least a portion of vibrational forces that have a directional component in the lateral direction A.

The vibration management assembly 80 can further include a third plurality of vibration dampeners 86 that are supported in the plenum 31 between one or both of the front and rear support walls 30e and 30f, respectively, and the computing housing 26. For instance, one or more up to all of the third plurality of vibration dampeners 86 can extend from the front support wall 30e to the front wall 26e of the computing housing 26. Alternatively or additionally, one or more up to all of the third plurality of vibration dampeners 86 can extend from the rear support wall 30f to the rear wall 26f of the computing housing 26. Thus, the third plurality of vibration dampeners 84 are configured to absorb at least a portion of vibrational forces that have a directional component in the longitudinal direction L.

The vibration management assembly 80 can further include a fourth plurality of vibration dampeners 88 that are supported in the plenum 31 between the top support wall 30g and the computing housing 26. For instance, the fourth plurality of vibration dampeners 88 can extend from the top support wall 30g to the ceiling 26b of the computing housing 26. Thus, the fourth plurality of vibration dampeners 88 are configured to absorb at least a portion of vibrational forces that have a directional component in the transverse direction T.

The vibration dampeners 82 can be made from any suitable polymeric or alternative material as desired. It is appreciated that the vibration management assembly 80 can include different numbers of the vibration dampeners 82-88, spaced apart from each other at different distances. For instance, because the vibration dampeners 82 support substantially an entirety of the weight of the computing room 28, the vibration dampeners 82 can define a density that is greater than that of each of the second, third, and fourth plurality of vibration dampeners 84 to 88. In accordance with the illustrated embodiment, adjacent ones of the vibration dampeners 82 are spaced from each other a distance that is less than the distance of adjacent ones of one or more up to all of the second plurality of dampeners 84, the third plurality of dampeners 86, and the fourth plurality of dampeners 88. Further, the spring constant of each of the plurality of vibration dampeners 82 can be different than the respective spring constant of one or more up to all of the second plurality of dampeners 84, the third plurality of dampeners 86, and the fourth plurality of dampeners 88. The spring constants of one or more up to all of the second plurality of dampeners 84, the third plurality of dampeners 86, and the fourth plurality of dampeners 88 can be equal to or different than the spring constants of one or more other up to all others of the second plurality of dampeners 84, the third plurality of dampeners 86, and the fourth plurality of dampeners 88.

The vibration management assembly 80 can further include at least one vibration sensor 90 that can be mounted anywhere in the computing room 28 as desired. For instance, the vibration sensor 90 can be configured as a piezoelectric sensor that can be configured to provide feedback that indicates measured vibration levels of the computing room 28. For instance, the vibration sensor 90, or a controller that receives electrical outputs from the vibration sensor 90, can activate an alarm if the measured vibration in the computing room 28 is greater than a preset threshold, an alarm can be activated.

Referring again to FIGS. 1A-6, a method 100 is provided for uploading data from a remote client location to a data storage device, such as the data storage devices 38b. The method can include the step 102 of receiving a data storage request from a client who is located remote from the portable data center 24, that is a sufficiently far distance from the portable data center 24 to prevent a hardware communication line from extending from a computing device of the client, from which data is to be stored, to the data port 50. It is appreciated that the data storage request can generally be of data that is sufficiently large that the transmission of the data over the Internet would be cost-excessive, time excessive, or both, compared to the time and cost to transport the portable data center to the client location and transmit the data to the computing devices 38 over the hardwire communication line 52. For instance, the data can be on the order of hundreds of gigabytes, terabytes, or even petabytes. In this regard, the computing devices 38, and in particular the data storage devices 38b, can have a cumulative data storage capacity as desired, for instance on the order of hundreds of gigabytes, terabytes, or even petabytes.

In response to the data storage request, the portable data center 24 which can be configured as a non-vehicular portable data center as described above, can be relocated, if necessary, to the mobile vehicle 22. Alternatively, the portable data center 24 can be supported by the mobile vehicle 22 prior to receipt of the data storage request. Next, at step 104, the mobile vehicle 22 can be transported from an origination location to a destination location, which can be defined by a remote location 92 of the client, while the portable data center 24 is supported by the mobile vehicle 22. The location 92 of the client can be the client location 48 that originated the data storage request, or a different location of the client. During transportation of the mobile data storage system 20, the method can include the step 106 of absorbing vibration forces imparted onto the mobile vehicle 22 at the vibration dampeners, such that vibration forces received by the at least one data storage device 38b, such as a plurality of the data storage devices 38b, are less than the vibration forces imparted onto the mobile vehicle 22.

The location 92 can be defined by a building 96 that houses at least one client computing device 98 of the client that is configured to transmit the data to be stored on one or more of the computing devices 38 of the portable data center 24. Once the portable data center 24 has been transported to the location 92, the hardwire communication line 52 can be connected to, for instance plugged into, the data port 50, thereby placing the rack systems 32 in electrical communication with the at least one client computing device 98 of the client. Next, the portable data center 24 can receive data from at least one computing device at the location 92 of the client over the hardwire communication line 52 at step 108. The received data can be stored on one or more of the storage devices 28b at step 110. The network devices 38a can route the received data to any one or more of the computing devices 38 in accordance with any suitable data storage protocol as desired. Thus, the method can further include the step of routing the received data, at the network devices 38a supported in the portable data center 24. Further, only those computing devices 38 that are identified to store data can be activated as desired, thereby conserving electrical power.

The method can further include the step 111 of activating the heat removal system 60 so as to draw cool ambient air through the computing devices. Step 112 can occur at any time during method 100 as desired, for instance after step 104. For instance, the step 112 can include the step of opening the louvers 76 to their respective open positions. Accordingly, during operation of the computing devices 38, and in particular during the transfer of data from the at least one client computing device 98 and the portable data center 24, the method can further include the step of drawing cool ambient air through the air intake 61 into the computing room 28. It should be appreciated that the air intake 61 can include any suitable filtration media as desired that can prevent certain particulates from entering the air intake 61. The drawing step can include the step of drawing air, such as ambient air from the ambient environment, through the support structure 30 and into the plenum 31, for instance through the plurality of first air intake vents 68, and directing the drawn ambient air from the plenum 31 into the computing room 28, for instance through the second plurality of intake vents 70. The method can further include the step of drawing the air through active ones of the computing devices 38. For instance, the method can include the step of actuating a fan in the data storage devices 38b so as to induce a negative pressure in the computing room 28 that draws the ambient air into the plenum 31, and further draws air in the computing room 28 into the data storage devices 38b. While the air is in the data storage devices 38b, the method can further include the step of transferring heat from the data storage devices 38b to the drawn air, and exhausting the drawn air out the computing room 28. The exhausting step can include the step of expelling the drawn air out of the computing devices 38 and the chimney 72, and directing the air out of the chimney 72, for instance out of the chimney outlet 72b and out of the portable data center 24 in the manner described above.

After the data received from the at least one client computing device 98 of the client has been stored in the computing devices 38, the method can include the step 112 of transporting the vehicle to a data center building that includes a plurality of rack systems of the type described above with respect to the rack systems 32. It is appreciated that the method 100 can include the step of deactivating the heat removal system 60, for instance by closing the louvers 76 can be closed and discontinuing electrical power from one or more up to all of the computing devices 38 prior to transporting the mobile data storage system from the location 92.

Once the portable data center 24 has been transported to the data center building, the method 100 can include the step 114 of transmitting at least a portion or an entirety of the data stored on the computing devices 38, and in particular at least a select one or ones of the data storage devices 38b, to at least one data storage device housed in the data center building. For instance, the select ones of the computing devices 38 that have stored at least a portion of the data from the client can be removed from the portable data center 24 and installed in the racks of the data center building, such that the select ones of the computing devices 38 are of the data center building. For instance, the access door 27 can be moved to its open position, and the data bus 29 and the power distribution unit 44 can be decoupled from the select ones of the computing devices 38. Next, the select ones of the computing devices 38 can be removed from the respective racks 36, transported into the data center building, and installed in any one of a plurality of racks of the data center building. Alternatively, a hard wire communication line can be established from the portable data center 24, for instance from the data port 50, to one or more computing devices in the data center building, so as to transmit the stored data from the select ones of the computing devices 38 to one or more computing devices housed in the data center building over the hardwire communication line. It is contemplated that the costs associated with transporting the portable data center 24 to the client location 48, receiving the data to be stored at the portable data center 24, transporting the portable data center 24 to the data center building, and transmitting the stored data to the one or more computing devices housed in the data center building can be less costly than transmitting the data to be stored to one or more computing devices of a data center over the internet, particularly when a large volume of data is to be stored.

It should be appreciated that transporting the portable data center 24 to the location 92, to the data center building, or both, can involve transportation on land, air transportation, water transportation, or combinations of the above. Accordingly, the transporting step can be via the mobile vehicle that can be configured as a land vehicle, such as a truck, train, or any alternative suitably constructed land vehicle, an air vehicle such as an airplane, a water vehicle such as a ship, or combinations thereof. For instance, a land vehicle can transport the portable data center 24 to a body of water or an airport, and the portable data center can be transferred to a water vehicle or an air vehicle, respectively. After the portable data center 24 has been transported over the body of water or through the air, the portable data center 24 can again be transferred to a land vehicle and transported to the location 92 of the client or location of the data center building.

It is further recognized that multiple data storage requests to store data can be received from multiple clients. Accordingly, after storing the data received at the location 92 of the client and before transporting the portable data center 24 to the data center building, the method can include the step 116 of transporting the mobile vehicle 22, and thus the portable data center 24, from the location 92 to a second destination location of a second client. The method thus can include the step of, at the portable data center 24, receiving data from at least one computing device of the second client over a hardwire communication line, and storing, on at least one of the data storage devices 38b of the portable data center 24, the data received from the second client. The above steps can be repeated for a third client, fourth client, and any number of clients as desired, prior to transporting the portable data center 24 to the data center building and transferring the stored data to at least one data storage device of the data center building. As described above, data may be loaded onto the high speed memory devices during connection with the building and, after being detached from building, memory may be transferred from the high speed to the low speed devices. As such, if for example, data storage in mobile vehicle 22 is retrieving from two or more locations, the total time for connection to each client location may be reduced. Further, it should be appreciated in one embodiment that the data received from the each client can be stored on separate computing devices 38, such that no computing device includes stored data from more than one client. In another embodiment, the data from each client can be independently encrypted using any suitable encryption protocol as desired. Thus, the data from each client can be segregated from the data from all other clients.

It should be noted that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. A portable data center comprising:
   a support structure that includes a support base configured to be supported by a support structure of a mobile vehicle, the support structure further including at least one side support wall that extends up from the support base, a front support wall and a rear support wall, wherein the at least one side support wall is adjacent to the front support wall and the rear support wall;
   a computing housing supported by the support base and defining a computing room, so as to define a plenum between the computing housing and the at least one side support wall, and at least one vibration dampener disposed in the plenum supported between the at least one side support wall and the computing housing, such that the at least one vibration dampener is configured to absorb at least a portion of laterally directed vibrational forces, wherein the at least one vibration dampener is spaced apart from the front support wall and the rear support wall;
   a plurality of rack systems supported in the computing room, the plurality of rack systems including a first rack system that includes a first rack and at least one network device supported by the first rack, and a second rack system that includes a second rack and at least one data storage device supported by the second rack and configured to be placed in communication with the at least one network device; and
   a data port configured to be connected to a hardwire communication line at a location of a client so as to receive data from at least one computing device at the location of the client that is also connected to the hardwire communication line, the data port in communication with the at least one network device, such that the network device is configured to route the received data to at least one of the data storage devices.

2. The portable data center as recited in claim 1, further comprising:
   a support structure that at least partially encapsulates the computing housing, the support structure including the support base,
   a first air intake vent that extends through the support structure and is in fluid communication with a plenum defined between the support structure and the computing housing;
   a second air intake vent that extends through the computing housing so as to place the plenum in fluid communication with the computing room; and
   an air outlet that extends through the computing housing so as to place the computing room in fluid communication with an ambient environment for air exhaust into the ambient environment.

3. The portable data center as recited in claim 1, wherein the plenum is further defined between the computing housing and the support base, and the at least one vibration dampener comprises a first plurality of vibration dampeners supported in the plenum between the support base and the computing housing and a second plurality of vibration dampeners supported in the plenum between the at least one side support wall and the computing housing.

4. The portable data center as recited in claim 1, further comprising an on-board electrical power source that is in electrical communication with the at least one network device and a plurality of data storage devices, so as to supply electrical power to the at least one network device and the plurality of data storage devices.

5. A mobile data storage system, comprising:
   a portable data center removably supported on a mobile vehicle, the portable data center comprising:
      a support structure that includes a support base configured to be supported on a mobile vehicle during data communications between the portable data center and at least one client computing device at a remote client location, the support structure further including at least one side support wall that extends up from the support base, a front support wall and a rear support wall, wherein the at least one side support wall is adjacent to the front support wall and the rear support wall;
      a computing housing supported by the support base and defining a computing room, wherein the portable data center defines a plenum between the computing housing and the at least one side support wall;
      at least one vibration dampener disposed in the plenum and supported between the computing housing and the at least one side support wall, such that the at least one vibration dampener is configured to absorb at least a portion of laterally directed vibrational forces, wherein the at least one vibration dampener is spaced apart from the front support wall and the rear support wall;
      a plurality of computing devices supported in the computing room; and
      a data port configured to be placed in connection with a hardwire communication line that is configured to be connected to the at least one client computing device at the remote client location so as to receive data from the client location and store the received data on at least one of the plurality of computing devices.

6. The mobile data storage system as recited in claim 5, wherein the plenum is defined between the computing housing and the support base, and the at least one vibration dampener comprises a first plurality of vibration dampeners supported in the plenum between the support base and the computing housing and a second plurality of vibration dampeners supported in the plenum between the at least one side support wall and the computing housing.

7. The mobile data storage system as recited in claim 6, wherein the first plurality of vibration dampeners have spring constants that are different than spring constants of one or more up to all of the second plurality of vibration dampeners.

8. The mobile data storage system as recited in claim 5, further comprising the mobile vehicle that includes a support member, wherein the support base is supported on the support member.

9. The mobile data storage system as recited in claim 5, further comprising an air intake that extends through the computing housing at a first location of the computing housing so as to place the computing room in fluid communication with an ambient environment outside the portable data center for air intake from the ambient environment, and an air outlet that extends through the computing housing at a second location of the computing housing that is different than the first location so as to place the computing room in fluid communication with the ambient environment for air exhaust into the ambient environment.

10. The mobile data storage system as recited in claim 9, further comprising a support structure that at least partially encapsulates the computing housing, the support structure including the support base, wherein the air intake comprises a first air intake vent that extends through the support structure and is in fluid communication with a plenum defined between the support structure and the computing housing, and a second air intake vent that extends through the computing housing so as to place the plenum in fluid communication with the computing room.

11. The mobile data storage system as recited in claim 10, wherein each of the computing devices comprises respective internal fans that draw air through the air intake and expel the drawn air through the air outlet.

12. The mobile data storage system as recited in claim 11, further comprising a chimney having at least one chimney intake that is positioned to receive the expelled air from the internal fans, the chimney further having a chimney outlet that is aligned with the air outlet.

13. The mobile data storage system as recited in claim 5, further comprising an on-board electrical power source that is in electrical communication with each of the plurality of computing devices so as to supply electrical power to the plurality of computing devices.

14. The mobile data storage system as recited in claim 13, wherein the plurality of computing devices are further in electrical communication with at least one backup electrical power source so as to receive electrical power from the backup electrical power source during a period of failure of the on-board power source.

15. The mobile data storage system as recited in claim 5, further comprising a plurality of rack systems supported in the computing room, each of the plurality of rack systems including a respective rack and at least one of the plurality of computing devices supported by the rack.

16. The mobile data storage system as recited in claim 15, wherein the plurality of computing devices comprise at least one network device and at least one data storage device, and the plurality of rack systems comprises a first at least one rack system that includes a first rack and the least one network device supported by the first rack, and a second at least one rack system that includes a second rack and the at least one data storage device supported by the second rack, and the at least one network device is configured to route the received data to the at least one data storage device.

17. A method of uploading data from a remote client location to a data storage device, the method comprising the steps of:
   receiving a data storage request;
   transporting a mobile vehicle from an origination location to a destination location, the mobile vehicle supporting a non-vehicular portable data center having a support base, a front support wall, a rear support wall and at least one side support wall that extends up from the support base, and a computing housing that contains at least one computing device, wherein the at least one side support wall and the computing housing define a plenum therebetween, and wherein the at least one side support wall is adjacent to the front support wall and the rear support wall;
   during the transporting step, causing at least a portion of lateral vibration forces imparted onto the mobile vehicle to be absorbed by at least one vibration dampener disposed in the plenum and supported between the at least one side support wall and the computing housing, such that vibration forces received by the at least one computing device are less than the vibration forces imparted onto the mobile vehicle, wherein the at least one vibration dampener is spaced apart from the front support wall and the rear support wall;

at the portable data center, receiving data from at least one computing device of the client at the destination location over a hardwire communication line; and storing the received data on at least one data storage device of the portable data center disposed in the computing housing.

18. The method as recited in claim 17, wherein the portable data center comprises a computing housing that defines a computing room, and the at least one data storage device is supported in the computing room, the method further comprising the step of drawing ambient air into the computing room and into at least one data storage device, transferring heat from the data storage device to the drawn air, and exhausting the drawn air out the computing room.

19. The method as recited in claim 18, wherein the portable data center further comprises a support structure that supports the computing housing so as to define a plenum between the support structure and the computing housing, and drawing ambient air further comprises the step of drawing ambient air through the support structure and into the plenum, and directing the drawn ambient air from the plenum into the computing room.

20. The method as recited in claim 19, wherein drawing ambient air further comprises actuating a fan in the at least one data storage device so as to induce a negative pressure in the computing room that draws the ambient air into the plenum.

21. The method as recited in claim 20, wherein exhausting the drawn ambient air further comprises expelling the drawn air out the at least one computing device and into a chimney, and directing the air out a chimney outlet and out of the portable data center.

22. The method as recited in claim 17, further comprising, after storing the received data, transporting the mobile vehicle to a data center building, removing the at least one computing device from the portable data center, and installing the at least one computing device in a rack in the data center building.

23. The method as recited in claim 17, further comprising, after storing the received data, transporting the mobile vehicle to a data center building, and transmitting at least a portion of the stored data to at least one computing device in the data center building over a hardwire communication line.

24. The method as recited in claim 23, further comprising, after storing the received data and before transporting the mobile vehicle to the data center building, the steps of:
    transporting the mobile vehicle from the destination location to a second destination location;
    at the portable data center, receiving data from at least one computing device of a second client at the second destination location over a hardwire communication line; and
    storing, on at least one data storage device of the portable data center, the data received from the at least one computing device of the second client.

* * * * *